United States Patent
Kim et al.

(10) Patent No.: US 11,243,232 B2
(45) Date of Patent: Feb. 8, 2022

(54) TEST APPARATUSES INCLUDING PROBE CARD FOR TESTING SEMICONDUCTOR DEVICES AND OPERATION METHODS THEREOF

(71) Applicant: Samsung Electronics Co., Ltd., Suwon-si (KR)

(72) Inventors: Gyuyeol Kim, Suwon-si (KR); Yukyum Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 212 days.

(21) Appl. No.: 16/587,557

(22) Filed: Sep. 30, 2019

(65) Prior Publication Data

US 2020/0386786 A1 Dec. 10, 2020

(30) Foreign Application Priority Data

Jun. 5, 2019 (KR) .................. 10-2019-0066927

(51) Int. Cl.
*G01R 31/317* (2006.01)
*G01R 31/319* (2006.01)
*G01R 1/073* (2006.01)

(52) U.S. Cl.
CPC ... *G01R 1/07342* (2013.01); *G01R 31/31708* (2013.01); *G01R 31/31713* (2013.01); *G01R 31/31905* (2013.01)

(58) Field of Classification Search
None
See application file for complete search history.

(56) References Cited

U.S. PATENT DOCUMENTS

| | | | |
|---|---|---|---|
| 5,101,149 A | 3/1992 | Adams et al. | |
| 5,550,480 A * | 8/1996 | Nelson | G01R 1/06705 324/756.03 |
| 6,456,103 B1 | 9/2002 | Eldridge et al. | |
| 6,747,469 B2 | 6/2004 | Rutten | |
| 6,927,078 B2 * | 8/2005 | Saijyo | G01R 3/00 257/E21.523 |
| 7,005,879 B1 | 2/2006 | Robertazzi | |
| 7,199,490 B2 | 4/2007 | Nomura | |
| 7,245,134 B2 | 7/2007 | Granicher et al. | |
| 7,888,957 B2 | 2/2011 | Smith et al. | |
| 8,030,959 B2 | 10/2011 | Franco et al. | |
| 2002/0036515 A1 | 3/2002 | Eldridge et al. | |
| 2003/0085726 A1 | 5/2003 | Rutten | |
| 2004/0004400 A1 | 1/2004 | Nomura | |
| 2005/0258835 A1 * | 11/2005 | Saijyo | G01R 3/00 324/500 |
| 2006/0170435 A1 | 8/2006 | Granicher et al. | |

(Continued)

FOREIGN PATENT DOCUMENTS

JP 01313767 A * 12/1989 ............ G01R 1/073
KR 20000045873 A 7/2000

*Primary Examiner* — Jermele M Hollington
(74) *Attorney, Agent, or Firm* — Harness, Dickey & Pierce, P.L.C.

(57) ABSTRACT

A probe apparatus includes a tester including a voltage supply, and a probe card including a first probe and a first sensing pin. The first probe is electrically connected to both an output port of the voltage supply and an electrode pad of a first semiconductor device. The first sensing pin is electrically connected to both a controller and a sensing pad of the first semiconductor device.

18 Claims, 8 Drawing Sheets

(56) References Cited

U.S. PATENT DOCUMENTS

| | | | |
|---|---|---|---|
| 2009/0309556 A1 | 12/2009 | Franco et al. | |
| 2010/0085069 A1 | 4/2010 | Smith et al. | |
| 2016/0041220 A1* | 2/2016 | Leutschacher | G01R 31/2601 324/756.03 |
| 2021/0055328 A1* | 2/2021 | Joo | G01R 1/06794 |
| 2021/0156902 A1* | 5/2021 | Ke | G01R 31/2644 |

* cited by examiner

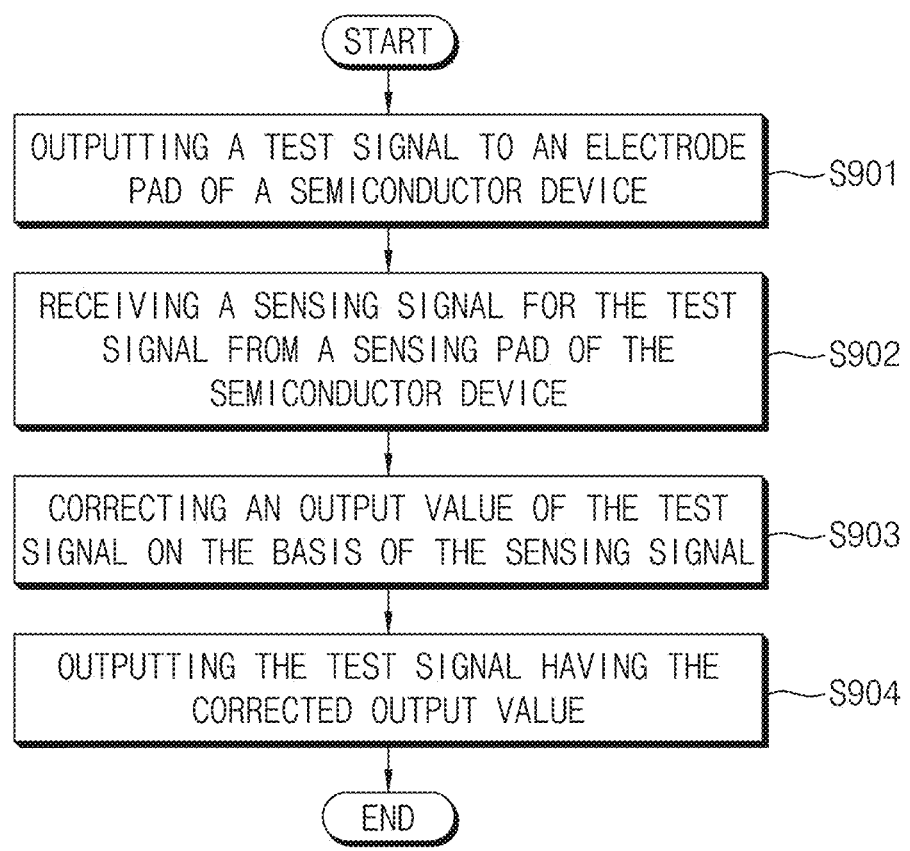

TEST APPARATUSES INCLUDING PROBE CARD FOR TESTING SEMICONDUCTOR DEVICES AND OPERATION METHODS THEREOF

CROSS-REFERENCE TO RELATED APPLICATION

This application claims from Korean Patent Application No. 10-2019-0066927, filed on Jun. 5, 2019, the disclosure of which is incorporated herein by reference in its entirety.

BACKGROUND

1. Field

Apparatuses and methods consistent with example embodiments relate to test apparatuses including a probe card for testing semiconductor devices, and operation methods thereof.

2. Description of Related Art

A plurality of semiconductor devices may be formed on a wafer by a semiconductor process. Electrical characteristics of each of the plurality of semiconductor devices may be tested using a probe card. A probe card may supply an electrical signal to each semiconductor device of the plurality of semiconductor devices. Each semiconductor device of the plurality of semiconductor devices may output ("transmit") a feedback signal corresponding to, and in response to, an electrical signal applied ("transmitted") thereto by the probe card. The probe card may transmit the feedback signal to test equipment. The test equipment may compensate for power to be supplied to test the plurality of semiconductor devices based on the feedback signal.

SUMMARY

Some example embodiments of the inventive concepts are directed to providing a test apparatus including a probe card for testing a semiconductor device, and an operation method thereof.

According to some example embodiments, a test apparatus may include a tester and a probe card. The tester may include a voltage supply and a controller. The probe card may include a first probe and a first sensing pin. The first probe may be electrically connected to both an output port of the voltage supply and an electrode pad of a first semiconductor device. The first sensing pin may be electrically connected to both the controller and a sensing pad of the first semiconductor device.

According to some example embodiments, a test apparatus may include a tester and a probe card. The tester may include a first voltage supply, a second voltage supply, and a controller. The probe card may include a first probe, a second probe, a first sensing pin, and a second sensing pin. The first probe may be electrically connected to both an output port of the first voltage supply and a first electrode pad of a first semiconductor device. The first sensing pin may be electrically connected to both the controller and a first sensing pad of the first semiconductor device. The second probe may be electrically connected to both an output port of the second voltage supply and a second electrode pad of the first semiconductor device. The second sensing pin may be electrically connected to both the controller and a second sensing pad of the first semiconductor device.

According to some example embodiments, a probe card may include a first probe, a first sensing pin, and a second sensing pin. The first probe may be configured to be electrically connected to an output port of a first voltage supply of a tester, and a first electrode pad of a first semiconductor device. The first sensing pin may be configured to be electrically connected to both a first controller of the tester and a first sensing pad of the first semiconductor device. The second sensing pin may be configured to be electrically connected to a second sensing pad of the first semiconductor device.

BRIEF DESCRIPTION OF THE DRAWINGS

FIG. 9 is a conceptual diagram illustrating an operation method of a test apparatus according to some example embodiments of the inventive concepts.

DETAILED DESCRIPTION

Figure 1A:
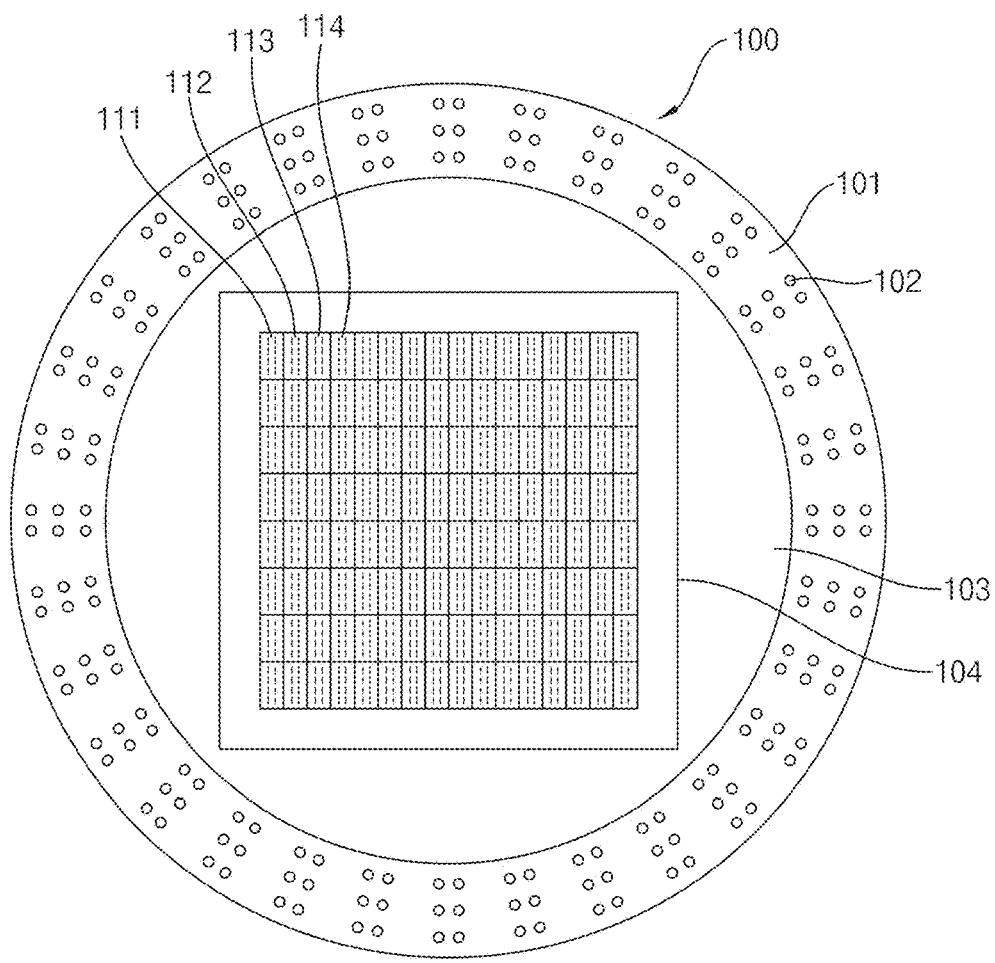
FIGS. 1A and 1B are conceptual diagrams illustrating a probe card and a wafer according to some example embodiments of the inventive concepts.
Figure 1B:
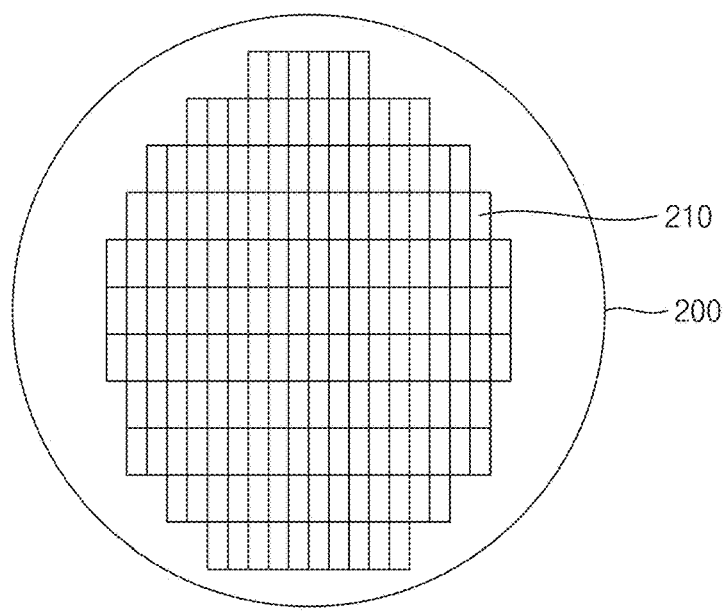

FIGS. 1A and 1B are conceptual diagrams illustrating a probe card and a wafer according to some example embodiments of the inventive concepts.

Referring to FIG. 1A, a probe card 100 may include a circuit board 101. A plurality of contact pads 102 may be disposed on the circuit board 101. The circuit board 101 may be fixed to the rest of the probe card 100 by a fixing plate 103. A plurality of probe blocks 104 may be disposed on the circuit board 101. The plurality of probe blocks 104 may include a plurality of probe pins 111, 112, 113, and 114.

As described herein, it will be understood that an element that is "on" another element may be above or beneath the other element. Additionally, it will be understood that an element that is "on" another element may be directly on the other element, such that the elements directly contact each other, or may be indirectly on the other element, such that the elements are isolated from direct contact with each other by one or more interposing spaces and/or structures.

The plurality of contact pads 102 may electrically connect the probe card 100 to a tester. The tester may be the same as or similar to one of testers 300 illustrated in FIGS. 2 to 8. The plurality of contact pads 102 may be supplied with (e.g., may receive) a voltage signal for testing electrical characteristics of a semiconductor device 210 from the tester. The plurality of contact pads 102 may, in response to being supplied with the voltage signal, provide a feedback signal provided from the semiconductor device 210 to the tester. A contact pad providing a feedback signal to a tester may be referred to as a sensing contact pad. For example, the plurality of contact pads 102 may include at least one sensing contact pad.

Referring to FIG. 1B, a plurality of semiconductor devices 210 may be formed on a wafer 200.

The plurality of semiconductor devices 210 may be brought into contact ("direct contact") with separate, respective probe pins of the plurality of probe pins 111 to 114. For example, the semiconductor devices 210 may be supplied with various voltages via the plurality of probe pins 111 to 114. The plurality of probe pins 111 to 114 may provide a voltage provided from the tester via the plurality of contact pads 102 to the semiconductor device 210. For example, the plurality of probe pins 111 to 114 may provide at least one of an external voltage VEXT, a data voltage VDDQ, or a command and address voltage VDDCA to the semiconductor device 210.

For example, the first probe pins 111 may provide a voltage to the semiconductor device 210. The semiconductor device 210 may provide a feedback signal of the voltage provided thereto to the first probe pins 111. The first probe pins 111 may transmit the feedback signal to the tester. The tester may test the semiconductor device 210 on the basis of the feedback signal.

Figure 2:
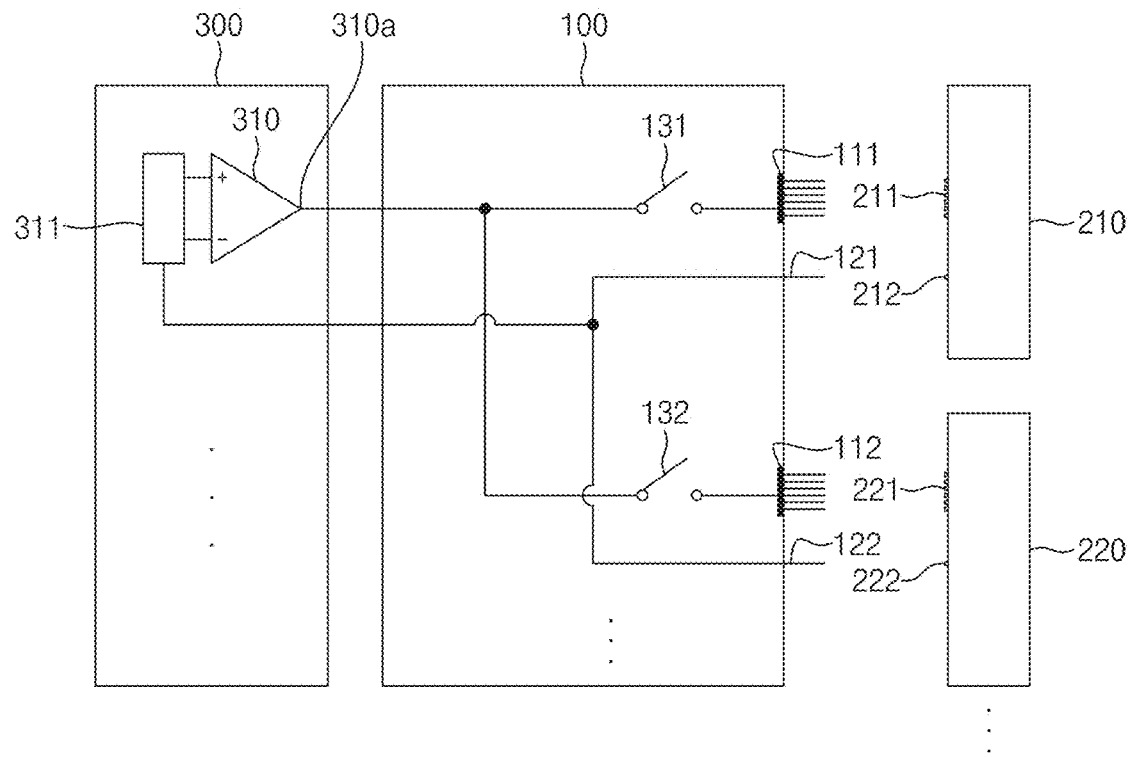
FIG. 2 is a conceptual diagram illustrating a test apparatus according to some example embodiments of the inventive concepts.

FIG. 2 is a conceptual diagram illustrating a test apparatus according to some example embodiments of the inventive concepts.

Referring to FIG. 2, the test apparatus may include a probe card 100 and a tester 300.

The probe card 100 may include a plurality of probe pins 111 and 112, a plurality of sensing pins 121 and 122, and a plurality of repeaters 131 and 132. It will be understood that a probe pin, as described herein, may be interchangeably referred to as simply a probe. For example, the first probe pins 111 may be referred to as simply one or more first probes, and the second probe pins 112 may be referred as simply one or more second probes. As shown in at least FIG. 2, the first probe pins 111 may include a plurality of pins, and the second probe pins 112 may include a separate plurality of pins.

The first probe pins 111 may be configured to be connected (e.g., electrically connected) to first electrode pads 211 of a first semiconductor device 210, for example based on the first semiconductor device 210 being brought into contact with the probe card 100 such that the first probe pins 111 directly contact the first electrode pads 211 of the first semiconductor device 210. The first probe pins 111 may be connected to the first repeater 131 and thus may be electrically connected to the output port 310a of the voltage supply 310 through the first repeater 131. It will be understood that "connected," as referred to herein, may be used interchangeably with "electrically connected."

The second probe pins 112 may be configured to be connected (e.g., electrically connected) to first electrode pads 221 of a second semiconductor device 220 for example based on the second semiconductor device 220 being brought into contact with the probe card 100 such that the second probe pins 112 directly contact the first electrode pads 221 of the second semiconductor device 220. The second probe pins 112 may be connected to the second repeater 132 and thus may be electrically connected to the output port 310a of the voltage supply 310 through the second repeater 132.

The first sensing pin 121 may be configured to be connected to a first sensing pad 212 of the first semiconductor device 210 to thereby be electrically connected thereto, for example based on the first semiconductor device 210 being brought into contact with the probe card 100 such that the first sensing pin 121 directly contacts the first sensing pad 212 of the first semiconductor device 210. The first sensing pin 121 may be connected to a first controller 311 to thereby be electrically connected thereto. Accordingly, the first sensing pin 121 may be configured to be electrically connected to both the first controller 311 and the first sensing pad 212 of the first semiconductor device 210, for example based on the first semiconductor device 210 being brought into contact with the probe card 100.

The second sensing pin 122 may be connected to a first sensing pad 222 of the second semiconductor device 220 to thereby be electrically connected thereto, for example based on the second semiconductor device 220 being brought into contact with the probe card 100 such that the second sensing pin 122 directly contacts the first sensing pad 222 of the second semiconductor device 220. The second sensing pin 122 may be connected to the first controller 311 to thereby be electrically connected thereto. Accordingly, the second sensing pin 122 may be configured to be electrically connected to both the first controller 311 and the first sensing pad 222 of the second semiconductor device 220, for example based on the second semiconductor device 220 being brought into contact with the probe card 100.

The first repeater 131 may be connected (e.g., directly connected) to the first probe pins 111. The first repeater 131 may be connected (e.g., directly connected) to an output port 310a of a first voltage supply 310. Accordingly, it will be understood that the first probe pins 111 may be configured to be electrically connected to both an output port 310a of the voltage supply 310 of the tester 300 and a separate first electrode pad 211 of the first semiconductor device 210. Additionally, it will be understood that the first repeater 131 may be connected (e.g., directly connected) between the output port 310a and the first probe pins 111 and may be configured to control an electrical connection between the output port 310a of the voltage supply 310 and the first probe pins 111.

The second repeater 132 may be connected (e.g., directly connected) to the second probe pins 112. The second repeater 132 may be connected (e.g., directly connected) to the output port 310a of the first voltage supply 310. Accordingly, it will be understood that the second probe pins 112 may be configured to be electrically connected to both an output port 310a of the voltage supply 310 of the tester 300 and a separate first electrode pad 221 of the second semiconductor device 220. Additionally, it will be understood that the second repeater 132 may be connected (e.g., directly connected) between the output port 310a and the second probe pins 112 and may be configured to control an electrical connection between the output port 310a of the voltage supply 310 and the second probe pins 112.

The tester 300 may include the first voltage supply 310 and the controller 311. As shown, a positive (+) input port and a negative (−) input port of the first voltage supply 310 may each be electrically connected to the first controller 311. As further shown, the output port 310a of the first voltage supply 310 may be connected to the first repeater 131 and the second repeater 132.

The first voltage supply 310 may be a programmable power supply (PPS). The first voltage supply 310 may include a voltage amplifier. The first voltage supply 310 may include a comparator. As shown, the first voltage supply 310 may include an output port 310a via which a voltage may be supplied ("transmitted") by the first voltage supply 310.

The first voltage supply 310 may receive a variable voltage, such as an external voltage VEXT, a data voltage VDDQ, or a command and address voltage VDDCA, from the first controller 311. The first voltage supply 310 may output a voltage corresponding to the variable voltage input thereto. The first voltage supply 310 may provide a voltage to the first repeater 131 and the second repeater 132 via the output port.

The first controller 311 may be connected to the first voltage supply 310, the first sensing pin 121, and the second sensing pin 122. In some example embodiments, the first controller may include a computer device. In some example embodiments, the first controller 311 may include a memory (e.g., a non-transitory computer-readable storage device) storing a program of instructions and a processor ("processing circuitry") configured to execute the program of instructions to implement the functionality of the first controller 311. The first controller 311 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The first repeater 131 and the second repeater 132 may each include a switch. For example, a repeater may be referred to as a switch. Accordingly, in some example embodiments, the first repeater 131 may be referred to interchangeably as a first switch of the probe card 100, and the second repeater 132 may be referred to interchangeably as a second switch of the probe card. The first repeater 131 and the second repeater 132 may each be configured to control an electrical connection between the output port 310a of the first voltage supply 310 and separate, respective probe pins of the plurality of probe pins 111 and 112 through an on/off operation.

For example, the first repeater 131 may provide the first probe pins 111 with a voltage provided from the first voltage supply 310. The second repeater 132 may provide the second probe pins 112 with the voltage provided from the first voltage supply 310.

The voltage provided via the first repeater 131 may be transmitted to the first electrode pads 211 of the first semiconductor device 210 via the first probe pins 111.

The voltage provided via the second repeater 132 may be transmitted to the first electrode pads 221 of the second semiconductor device 220 via the second probe pins 112.

The first electrode pads 211 of the first semiconductor device 210 and the first sensing pads 212 of the first semiconductor device 210 may be electrically connected to each other. The first electrode pads 211 and the first sensing pad 212 of the first semiconductor device 210 may be electrically connected to each other to have the same voltage. For example, the first sensing pad 212 may be connected to the first electrode pads 211 via a separate internal circuit of the first semiconductor device 210 to sense a voltage or electric potential of the first electrode pads 211. In some example embodiments, the first sensing pad 212 and the first electrode pads 211 may be integrally formed as one electrode pad. The first electrode pads 211 and the first sensing pad 212 of the first semiconductor device 210 may be directly connected to each other. For example, a separate electrical element may not be disposed between the first electrode pads 211 and the first sensing pad 212 of the first semiconductor device 210.

The first electrode pads 221 and the first sensing pad 222 of the second semiconductor device 220 may be electrically connected to each other. The first electrode pads 221 and the first sensing pad 222 of the second semiconductor device 220 may be electrically connected to each other to have the same voltage. For example, the first sensing pad 222 may be connected to the first electrode pads 221 via a separate internal circuit of the second semiconductor device 220 to sense a voltage or electric potential of the first electrode pads 221. In some example embodiments, the first sensing pad 222 and the first electrode pads 221 may be integrally formed as one electrode pad. The first electrode pads 221 and the first sensing pad 222 of the second semiconductor device 220 may be directly connected to each other. For example, a separate electrical element may not be disposed between the first electrode pads 221 and the first sensing pad 222 of the second semiconductor device 220.

The first sensing pin 121 may sense a voltage of the first semiconductor device 210 through the first sensing pad 212. The sensed voltage may be transmitted to the first controller 311.

The second sensing pin 122 may sense a voltage of the second semiconductor device 220 through the first sensing pad 222. The sensed voltage may be transmitted to the first controller 311.

The first controller 311 may be provided with the sensed voltage from the first semiconductor device 210 when the first repeater 131 is on and the second repeater 132 is off. The first controller 311 may be provided with the sensed voltage from the second semiconductor device 220 when the first repeater 131 is off and the second repeater 132 is on.

For example, the first controller 311 may provide an initial voltage to the first voltage supply 310. The first voltage supply 310 may provide the initial voltage provided from the first controller 311 to the first electrode pads 211 of the first semiconductor device 210 via the first repeater 131 and the first probe pins 111. The sensed voltage may be fed back to the first controller 311 from the first sensing pad 212 via the first sensing pin 121. The first controller 311 may correct the initial voltage on the basis of the sensed voltage and output the corrected initial voltage. For example, the first controller 311 may compensate for the initial voltage on the basis of the difference between the initial voltage and the sensed voltage and output the compensated-for voltage. For example, the first controller 311 may provide the corrected initial voltage to the first voltage supply 310. The first voltage supply 310 may be supplied with the corrected initial voltage from the first controller 311. The first voltage supply 310 may output the corrected initial voltage.

In addition, the first voltage supply 310 may provide the initial voltage provided from the first controller 311 to the first electrode pads 221 of the second semiconductor device 220 via the second repeater 132 and the second probe pins 112. The sensed voltage may be fed back to the first controller 311 from the second sensing pin 122 via the second sensing pin 122. The first controller 311 may correct the initial voltage on the basis of the sensed voltage and output the corrected initial voltage. For example, the first controller 311 may compensate for the initial voltage on the basis of the difference between the initial voltage and the sensed voltage and output the compensated-for voltage. For example, the first controller 311 may provide the corrected initial voltage to the first voltage supply 310. The first voltage supply 310 may be supplied with the corrected initial voltage from the first controller 311. The first voltage supply 310 may output the corrected initial voltage.

In some example embodiments, the first sensing pin 121 and the second sensing pin 122 may be connected directly to the negative (−) input port of the first voltage supply 310. For example, the first sensing pin 121 and the second sensing pin 122 may not be connected to the first controller 311 but may be connected directly to the negative (−) input port of the first voltage supply 310. When the first sensing pin 121 and the second sensing pin 122 are directly connected to the negative (−) input port of the first voltage supply 310, the sensing signal may be fed back to the first voltage supply 310 from the first sensing pad 212 via the negative (−) input port through the first sensing pin 121. Furthermore, the sensed voltage may be fed back to the first voltage supply 310 from the first sensing pad 222 via the negative (−) input port through the second sensing pin 122. The first voltage supply 310 may correct the initial voltage on the basis of the sensed voltage and output the corrected initial voltage. For example, the first voltage supply 310 may compensate for the initial voltage on the basis of the difference between the initial voltage and the sensed voltage and output the compensated-for voltage.

The first controller 311 may identify the difference between an output voltage and a voltage input to the first semiconductor device 210 by receiving a feedback of a voltage sensed by the first semiconductor device 210 via at least one of the first sensing pin 121 or the second sensing pin 122. The first controller 311 may increase voltage control efficiency by identifying the difference between the output voltage and the voltage input to the first semiconductor device 210.

In some example embodiments, thicknesses of the first sensing pin 121 and the second sensing pin 122 may be different from those of the first probe pins 111 and the second probe pins 112, respectively. For example, the thicknesses of the first sensing pin 121 and the second sensing pin 122 may be respectively greater than those of the first probe pins 111 and the second probe pins 112. In another example, the thickness of the first sensing pin 121 may be greater than a thickness of each pin of a plurality of pins of the first probe pins 111, and the thickness of the second sensing pin 122 may be greater than a thickness of each pin of a plurality of pins of the second probe pins 112. Resistance values of the first sensing pin 121 and the second sensing pin 122 may be respectively smaller than those of the first probe pins 111 and the second probe pins 112 due to the different thicknesses of these pins. The accuracy of voltages sensed via the first sensing pin 121 and the second sensing pin 122 may increase due to the lower resistance values of the first sensing pin 121 and the second sensing pin 122.

Each of the first semiconductor device 210 and the second semiconductor device 220 may be one semiconductor wafer. In some example embodiments, the first semiconductor device 210 and the second semiconductor device 220 may be configured as one semiconductor wafer.

In some example embodiments, each of the first semiconductor device 210 and the second semiconductor device 220 may be a semiconductor chip formed on the wafer 200. In some example embodiments, each of the first semiconductor device 210 and the second semiconductor device 220 may be a separate semiconductor chip separated from the wafer 200.

FIG. 2 illustrates that the probe card 100 includes two sets of the probe pins 111 and 112 and the two sensing pins 121 and 122 for convenience of explanation, but the probe card 100 may include three or more sets of probe pins and three or more sensing pins.

Although FIG. 2 illustrates the probe card 100 for testing the two semiconductor devices 210 and 220 for convenience of explanation, the probe card 100 may be used to test three or more semiconductor devices.

Figure 3:
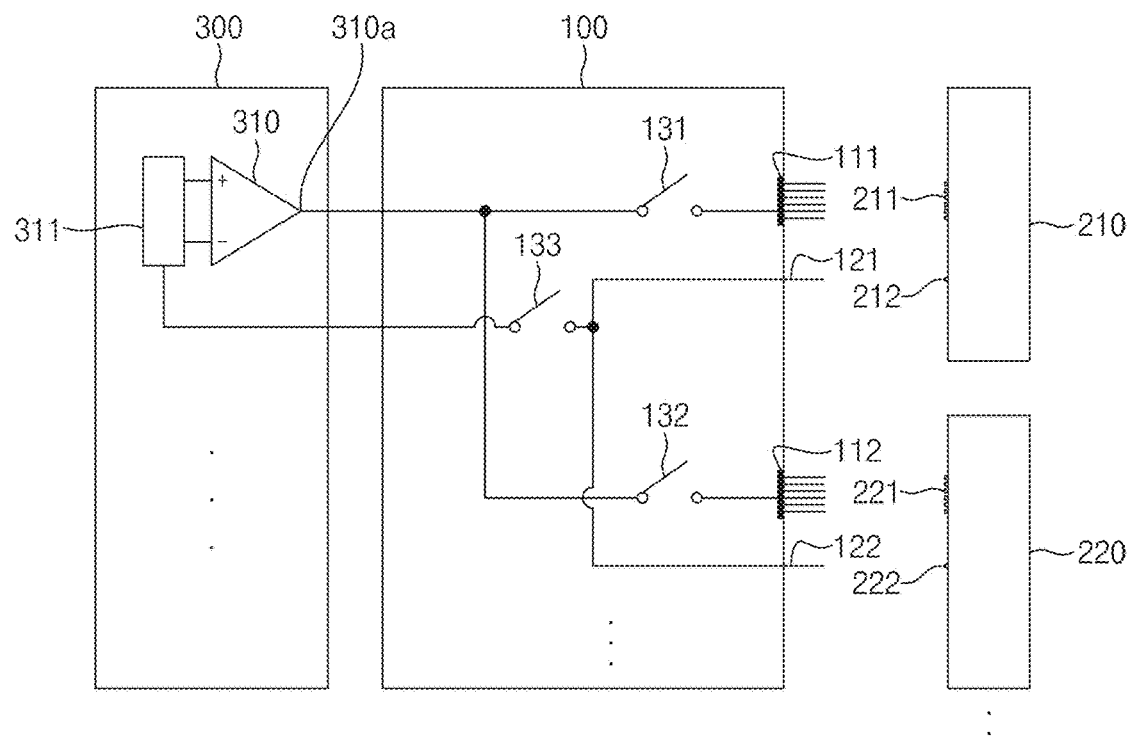
FIG. 3 is a conceptual diagram illustrating a test apparatus according to some example embodiments of the inventive concepts.

FIG. 3 is a conceptual diagram illustrating a test apparatus according to some example embodiments of the inventive concepts.

Referring to FIG. 3, a probe card 100 of a test apparatus according to some example embodiments may further include a third repeater 133, also referred to herein as a third switch, as compared to the probe card 100 of FIG. 2.

One end of the third repeater 133 may be connected (e.g., directly connected) to a first controller 311. Another end of the third repeater 133 may be connected (e.g., directly connected) to a first sensing pin 121 and a second sensing pin 122. Thus, the third repeater 133 may be connected (e.g., directly connected) between the controller 311 and the first and second sensing pins 121 and 122. The third repeater 133 may be configured to control an electrical connection between the first controller 311 and the first and second sensing pins 121 and 122 through an on-off operation. The third repeater 133 may provide the first controller 311 with a voltage sensed by a first sensing pad 212 of a first semiconductor device 210 via the first sensing pin 121 and a voltage sensed by a first sensing pad 222 of a second semiconductor device 220 via the second sensing pin 122.

Figure 4:
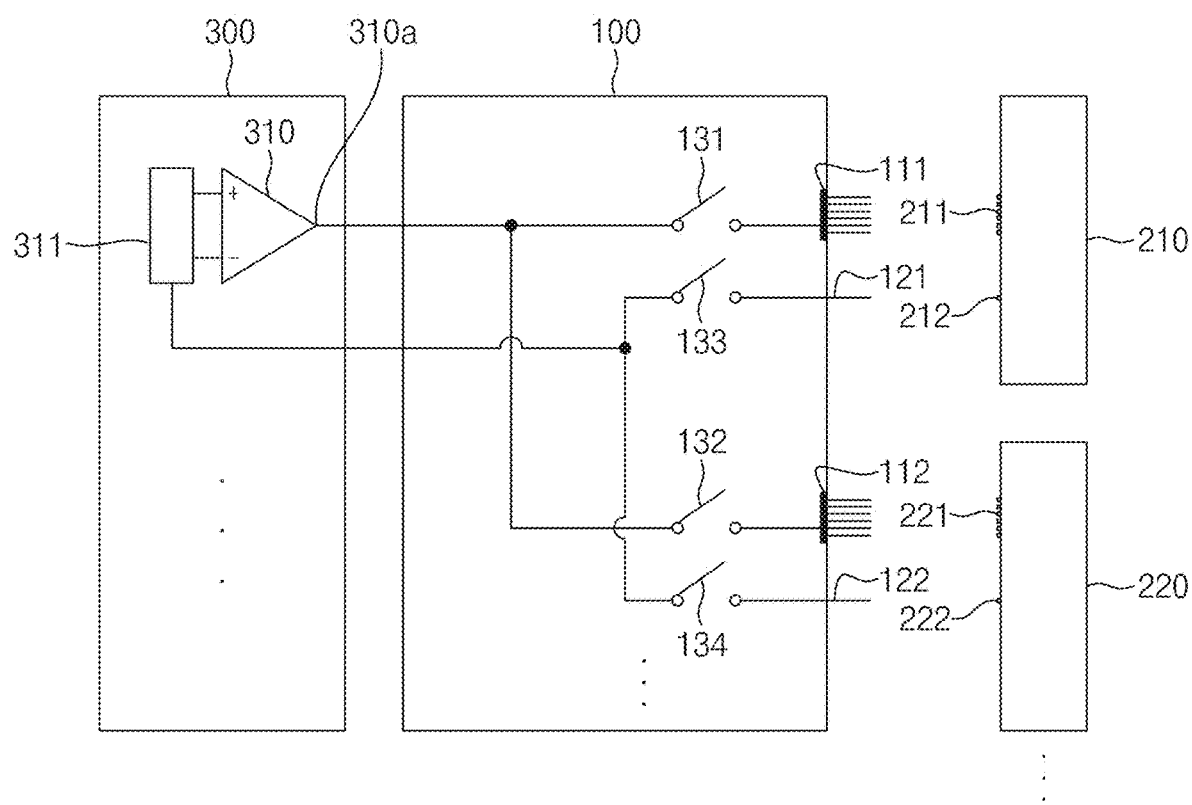
FIG. 4 is a conceptual diagram illustrating a test apparatus according to some example embodiments of the inventive concepts.

FIG. 4 is a conceptual diagram illustrating a test apparatus according to some example embodiments of the inventive concepts.

Referring to FIG. 4, a probe card 100 of a test apparatus according to some example embodiments may be different from the probe card 100 of FIG. 3 in terms of a position of a third repeater 133, also referred to herein as a third switch. The probe card 100 may further include a fourth repeater 134, also referred to herein as a fourth switch.

For example, the third repeater 133 may be connected (e.g., directly connected) between a first controller 311 and a first sensing pin 121. One end of the third repeater 133 may be connected (e.g., directly connected) to the first controller 311. Another end of the third repeater 133 may be connected (e.g., directly connected) to the first sensing pin 121. The third repeater 133 may be configured to control an electrical connection between the first controller 311 and the first sensing pin 121 through an on-off operation. The third repeater 133 may provide a voltage sensed by a first sensing pad 212 of a first semiconductor device 210 via the first sensing pin 121 to the first controller 311 through the on operation.

The fourth repeater 134 may be connected (e.g., directly connected) between the first controller 311 and a second sensing pin 122. One end of the fourth repeater 134 may be connected (e.g., directly connected) to the first controller 311. Another end of the fourth repeater 134 may be connected (e.g., directly connected) to the second sensing pin 122. The fourth repeater 134 may be configured to control an electrical connection between the first controller 311 and the second sensing pin 122 through an on-off operation. The fourth repeater 134 may provide a voltage sensed by the first sensing pad 222 of the second semiconductor device 220 via the second sensing pin 122 to the first controller 311 through the on operation.

The first controller 311 may be selectively provided with the voltage sensed by the first semiconductor device 210 and the voltage sensed by the second semiconductor device 220 via the third repeater 133 and the fourth repeater 134. The first controller 311 may increase the efficiency of controlling an output voltage by selectively receiving a sensed voltage.

Figure 5:
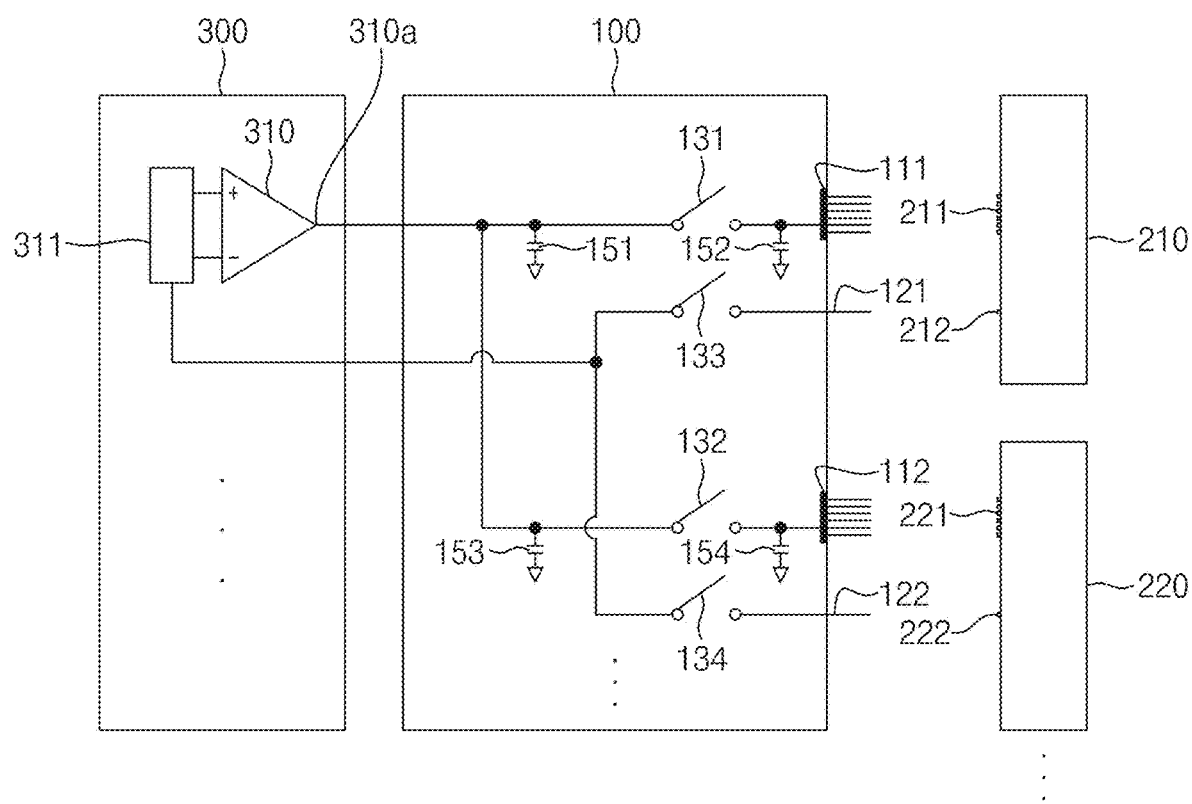
FIG. 5 is a conceptual diagram illustrating a test apparatus according to some example embodiments of the inventive concepts.

FIG. 5 is a conceptual diagram illustrating a test apparatus according to some example embodiments of the inventive concepts.

Referring to FIG. 5, a probe card 100 of a test apparatus may further include a plurality of capacitors 151 to 154, when compared with the probe card 100 of FIG. 4. One end of the first capacitor 151 may be connected to an output port 310a of a first voltage supply 310 and a first repeater 131. Another end of the first capacitor 151 may be grounded. One end of the second capacitor 152 may be connected to the first repeater 131 and first probe pins 111. Another end of the second capacitor 152 may be grounded.

One end of the third capacitor 153 may be connected to the output port 310a of the first voltage supply 310 and a second repeater 132. Another end of the third capacitor 153 may be grounded. The fourth capacitor 154 may be connected to the second repeater 132 and second probe pins 112. Another end of the fourth capacitor 154 may be grounded. Accordingly, each of the capacitors 151, 152, 153, and 154 may be referred to herein interchangeably as a ground capacitor.

The probe card 100 may reduce an extent of a voltage drop in the probe card 100 through the plurality of capacitors 151 to 154 during transmission of a voltage output from the first voltage supply 310 to a first semiconductor device 210 and a second semiconductor device 220.

Figure 6:
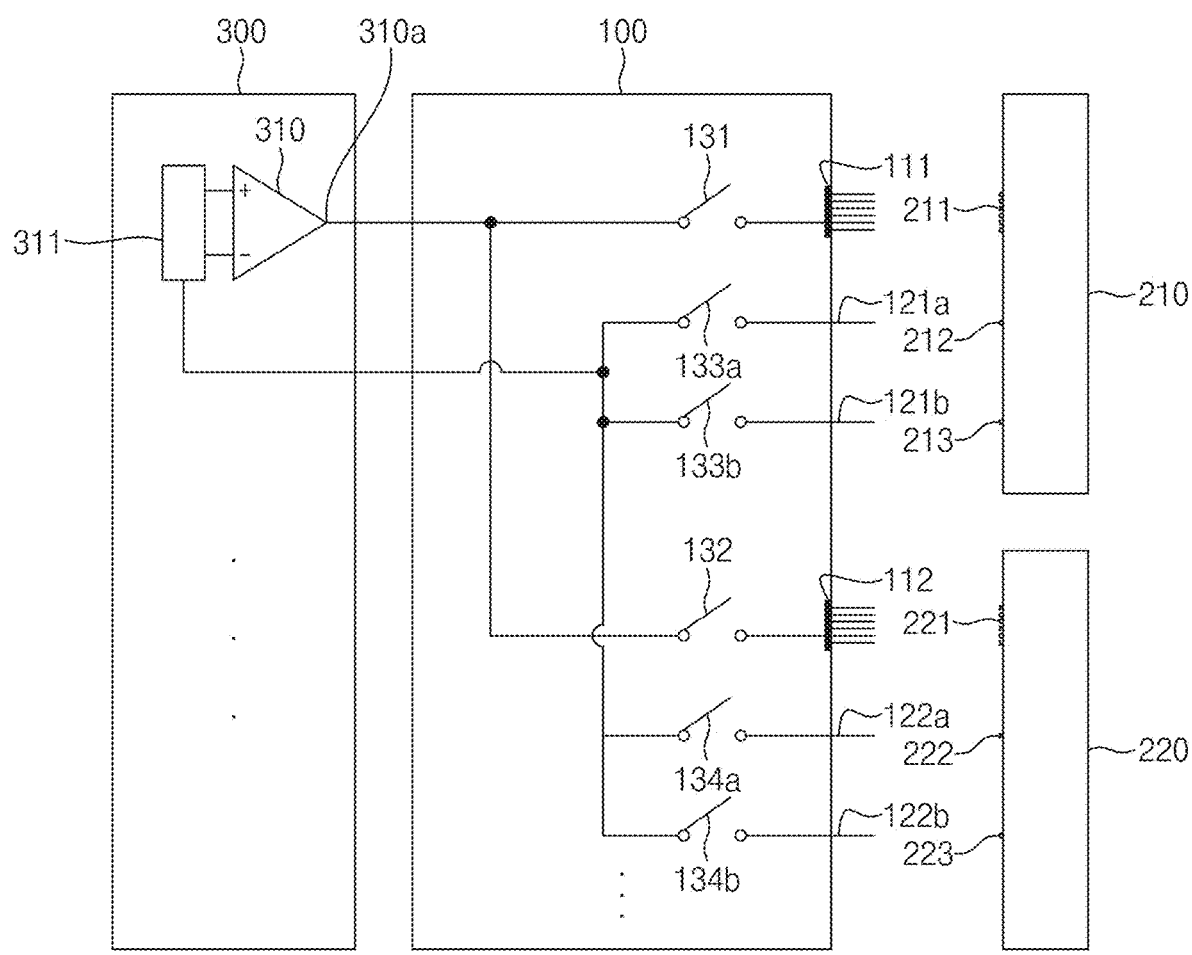
FIG. 6 is a conceptual diagram illustrating a test apparatus according to some example embodiments of the inventive concepts.

FIG. 6 is a conceptual diagram illustrating a test apparatus according to some example embodiments of the inventive concepts.

A first voltage supply 310 may output different types of voltages. For example, the first voltage supply 310 may output at least two voltages among an external voltage VEXT, a data voltage VDDQ, and a command and address signal voltage VDDCA.

For example, the first voltage supply 310 may provide the external voltage VEXT to first probe pins 111. In addition, the first voltage supply 310 may transmit the data voltage VDDQ to the first probe pins 111.

A first voltage corresponding to the external voltage VEXT may be provided to first electrode pads 211 of a first semiconductor device 210 via some of the first probe pins 111. A second voltage corresponding to the data voltage VDDQ may be provided to the first electrode pads 211 of the first semiconductor device 210 via some of the first probe pins 111.

The first voltage corresponding to the external voltage VEXT may be provided to first electrode pads 221 of a second semiconductor device 220 via some of second probe pins 112. The second voltage corresponding to the data voltage VDDQ may be provided to the first electrode pads 221 of the second semiconductor device 220 via some of the second probe pins 112.

The first voltage and the second voltage may be the same. In some example embodiments, the first voltage and the second voltage may be different.

Referring to FIG. 6, a probe card 100 of the test apparatus according to some example embodiments may be partially different from the probe card 100 of FIG. 4.

For example, first sensing pins 121a and 121b may be divided into a first-a sensing pin 121a and a first-b sensing pin 121b when compared with the first sensing pins 121 of FIG. 3.

Second sensing pins 122a and 122b may be divided into a second-a sensing pin 122a and a second-b sensing pin 122b when compared with the second sensing pins 122 of FIG. 3.

Third repeaters 133a and 133b may be divided into a third-a repeater 133a and a third-b repeater 133b when compared with the third repeater 133 of FIG. 3.

Fourth repeaters 134a and 134b may be divided into a fourth-a repeater 134a and a fourth-b repeater 134b when compared with the fourth repeater 134 of FIG. 3. The first-a sensing pin 121a may be configured to be electrically connected to both the controller 311 and a first sensing pad 212 of the first semiconductor device 210, for example based on the first semiconductor device 210 being brought into contact with the probe card 100. The first-b sensing pin 121a may be configured to be electrically connected to both the controller 311 and a second sensing pad 213 of the first semiconductor device 210, for example based on the first semiconductor device 210 being brought into contact with the probe card 100.

The first-a sensing pin 121a may sense a first voltage via a first sensing pad 212 of a first semiconductor device 210. The first-b sensing pin 121b may sense a second voltage via a second sensing pad 213 of the first semiconductor device 210.

The probe card 100 may selectively control movement of the sensed first and second voltages through the third-a repeater 133a and the third-b repeater 133b.

The third-a repeater 133a may be connected (e.g., directly connected) between the controller 311 and the first-a sensing pin 121a. The third-b repeater 133b may be connected (e.g., directly connected) between the controller 311 and the first-b sensing pin 121b. The third-a repeater 133a may control the movement of a first voltage of the first semiconductor device 210 sensed via the first-a sensing pin 121a. For example, the third-a repeater 133a may provide the first voltage of the first semiconductor device 210 to the first controller 311 through an on operation.

The third-b repeater 133b may control the movement of a second voltage of the first semiconductor device 210 sensed via the first-b sensing pin 121b. For example, the third-b repeater 133b may provide the second voltage of the first semiconductor device 210 to the first controller 311 through the on operation.

The second-a sensing pin 122a may be configured to be electrically connected to both the controller 311 and a first sensing pad 212 of the first semiconductor device 210, for example based on the first semiconductor device 210 being brought into contact with the probe card 100. The first-b sensing pin 121a may be configured to be electrically connected to both the controller 311 and a second sensing pad 213 of the first semiconductor device 210, for example based on the first semiconductor device 210 being brought into contact with the probe card 100.

The second-a sensing pin 122a may sense the first voltage via a first sensing pad 222 of a second semiconductor device 220. The second-b sensing pin 122b may sense the second voltage via a second sensing pad 243 of the second semiconductor device 220.

The probe card 100 may selectively control the movement of the sensed first and second voltages through the fourth-a repeater 134a and the fourth-b repeater 134b.

The fourth-a repeater 134a may be connected (e.g., directly connected) between the controller 311 and the second-a sensing pin 122a. The fourth-b repeater 134b may be connected (e.g., directly connected) between the controller 311 and the second-b sensing pin 122b. The fourth-a repeater 134a may control the movement of a first voltage of the second semiconductor device 220 sensed through the second-a sensing pin 122a. For example, the fourth-a repeater 134a may provide the first voltage of the second semiconductor device 220 to the first controller 311 through the on operation.

The fourth-b repeater 134b may control the movement of a second voltage of the second semiconductor device 220 sensed through the second-b sensing pin 122b. For example, the fourth-b repeater 134b may provide the second voltage of the second semiconductor device 220 to the first controller 311 through the on operation.

The first voltage supply 310 may be selectively supplied with the sensed first and second voltages through the third-a repeater 133a and the third-b repeater 133b. The first voltage supply 310 may increase the efficiency of controlling the first and second voltages by selectively receiving the first voltage and the second voltage.

Figure 7:
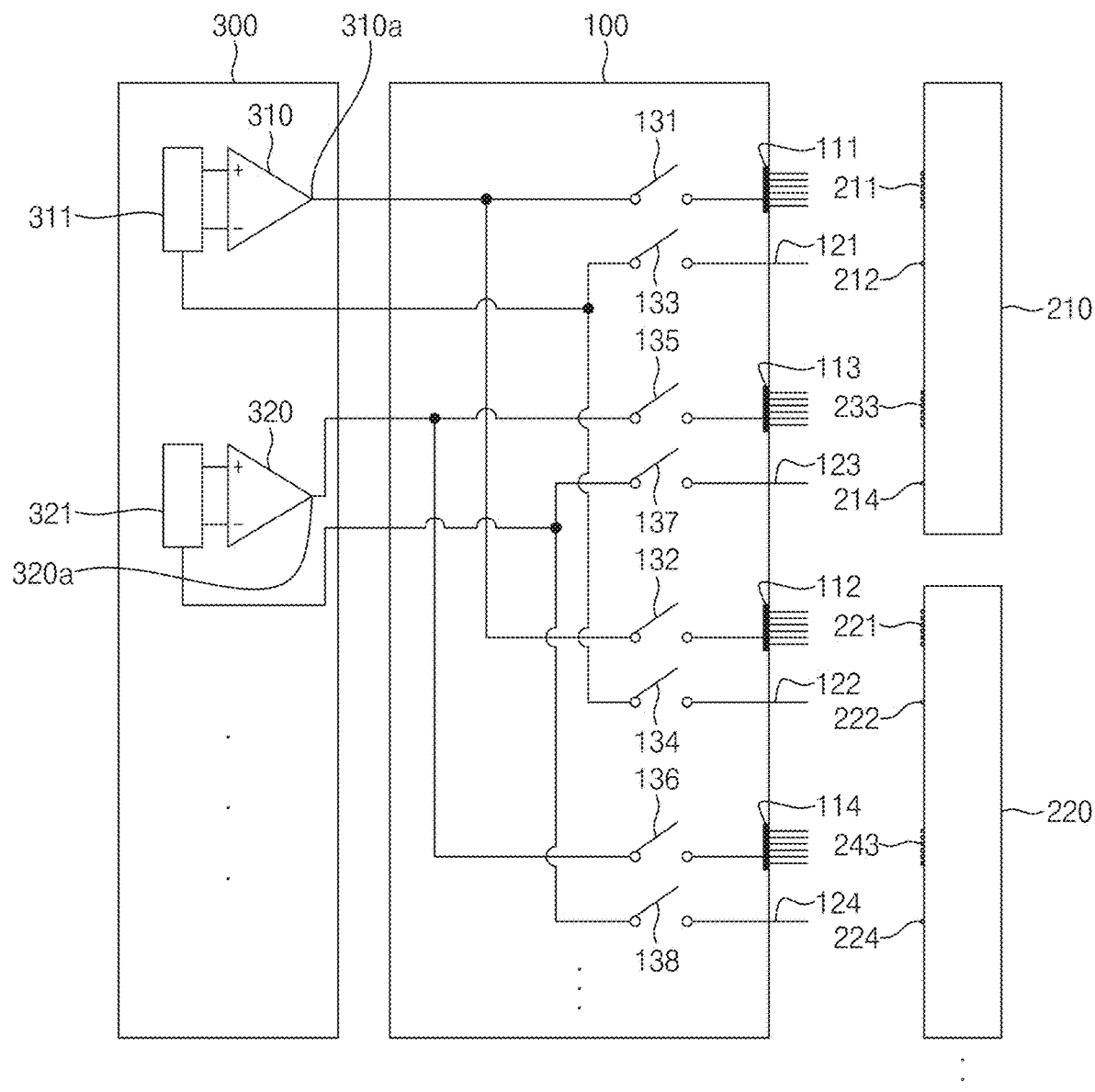
FIG. 7 is a conceptual diagram illustrating a test apparatus according to some example embodiments of the inventive concepts.

FIG. 7 is a conceptual diagram illustrating a test apparatus according to some example embodiments of the inventive concepts.

Referring to FIG. 7, a probe card 100 of the test apparatus according to some example embodiments may further include third probe pins 113, fourth probe pins 114, a third sensing pin 123, a fourth sensing pin 124, and fifth to eighth repeaters 135 to 138 when compared with the probe card 100 of FIG. 6. A tester 300 may further include a second voltage supply 320 and a second controller 321 when compared with the tester 300 of FIG. 6. In some example embodiments, the second controller 321 may be coupled to a first controller 311. The second controller 321 may have the same structure as the first controller 311 as described above. For example, the first controller 311 and the second controller 321 may be integrally formed as one controller (e.g., controller 311) that is connected to both the positive (+) input port and the negative (−) input port of both the first and second voltage supplies 310 and 320.

The third probe pins 113 may be connected to the second voltage supply 320. For example, the third probe pins 113 may be connected to the second voltage supply 320 via the fifth repeater 135. The third probe pins 113 may be configured to be connected (e.g., electrically connected) to second electrode pads 233 of a first semiconductor device 210, for example based on the first semiconductor device 210 being brought into contact with the probe card 100 such that the third probe pins 113 directly contact the second electrode pads 233 of the first semiconductor device 210.

The fifth repeater 135 may be connected (e.g., directly connected) to the second voltage supply 320. The fifth repeater 135 may be connected (e.g., directly connected) to the third probe pins 113. Accordingly, it will be understood that the third probe pins 113 may be configured to be electrically connected to both an output port 320a of the second voltage supply 320 of the tester 300 and a separate second electrode pad 233 of the first semiconductor device 210.

The fourth probe pins 114 may be connected to the second voltage supply 320. For example, the fourth probe pins 114 may be connected to the second voltage supply 320 via the sixth repeater 136. The fourth probe pins 114 may be configured to be connected (e.g., electrically connected) to second electrode pads 223 of a second semiconductor device 220, for example based on the second semiconductor device 220 being brought into contact with the probe card 100 such that the fourth probe pins 114 directly contact the second electrode pads 223 of the second semiconductor device 220.

The sixth repeater 136 may be connected (e.g., directly connected) to the second voltage supply 320. The sixth repeater 136 may be connected (e.g., directly connected) to the fourth probe pins 114. Accordingly, it will be understood that the fourth probe pins 114 may be configured to be electrically connected to both an output port 320a of the second voltage supply 320 of the tester 300 and a separate second electrode pad 243 of the second semiconductor device 220.

The third sensing pin 123 may be connected to the second controller 321. For example, the third sensing pin 123 may be connected to the second controller 321 through the seventh repeater 137. The third sensing pin 123 may be configured to be connected to a second sensing pad 214 of the first semiconductor device 210 to thereby be electrically connected thereto, for example based on the first semiconductor device 210 being brought into contact with the probe card 100 such that the third sensing pin 123 directly contacts the second sensing pad 214 of the first semiconductor device 210. Accordingly, third sensing pin 123 may be configured to be electrically connected to both the first controller 311 and the second sensing pad 214 of the first semiconductor device 210, for example based on the first semiconductor device 210 being brought into contact with the probe card 100.

The seventh repeater 137 may be connected (e.g., directly connected) to the second controller 321. The seventh repeater 137 may be connected (e.g., directly connected) to the third sensing pin 123. Accordingly, it will be understood that the third sensing pin 123 may be configured to be electrically connected to both the second controller 321 and a separate second sensing pad 214 of the first semiconductor device 210.

The fourth sensing pin 124 may be connected to the second controller 321. For example, the fourth sensing pin 124 may be coupled to the eighth repeater 138. The fourth sensing pin 124 may be configured to be connected to a second sensing pad 224 of the second semiconductor device 220, to thereby be electrically connected thereto, for example based on the second semiconductor device 220 being brought into contact with the probe card 100 such that the fourth sensing pin 124 directly contacts the second sensing pad 224 of the second semiconductor device 220. Accordingly, fourth sensing pin 124 may be configured to be electrically connected to both the second controller 321 and the second sensing pad 224 of the second semiconductor device 220, for example based on the second semiconductor device 220 being brought into contact with the probe card 100.

The eighth repeater 138 may be connected (e.g., directly connected) to the second controller 321. The eighth repeater 138 may be connected (e.g., directly connected) to the fourth sensing pin 124. Accordingly, it will be understood that the fourth sensing pin 124 may be configured to be electrically connected to both the second controller 321 and a separate second sensing pad 224 of the second semiconductor device 220.

A positive (+) input port and a negative (−) input port of the second voltage supply 320 may be connected to the second controller 321. The second controller 321 may provide a second voltage to the second voltage supply 320. The second voltage supply 320 may output the second voltage supplied from the second controller 321. The second voltage may be different from the first voltage. For example, the first voltage may correspond to an external voltage VEXT. The second voltage may correspond to a data voltage VDDQ.

The tester 300 may increase the efficiency for testing the first semiconductor device 210 by providing different voltages to the first semiconductor device 210 via the voltage supplies 310 and 320.

Figure 8:
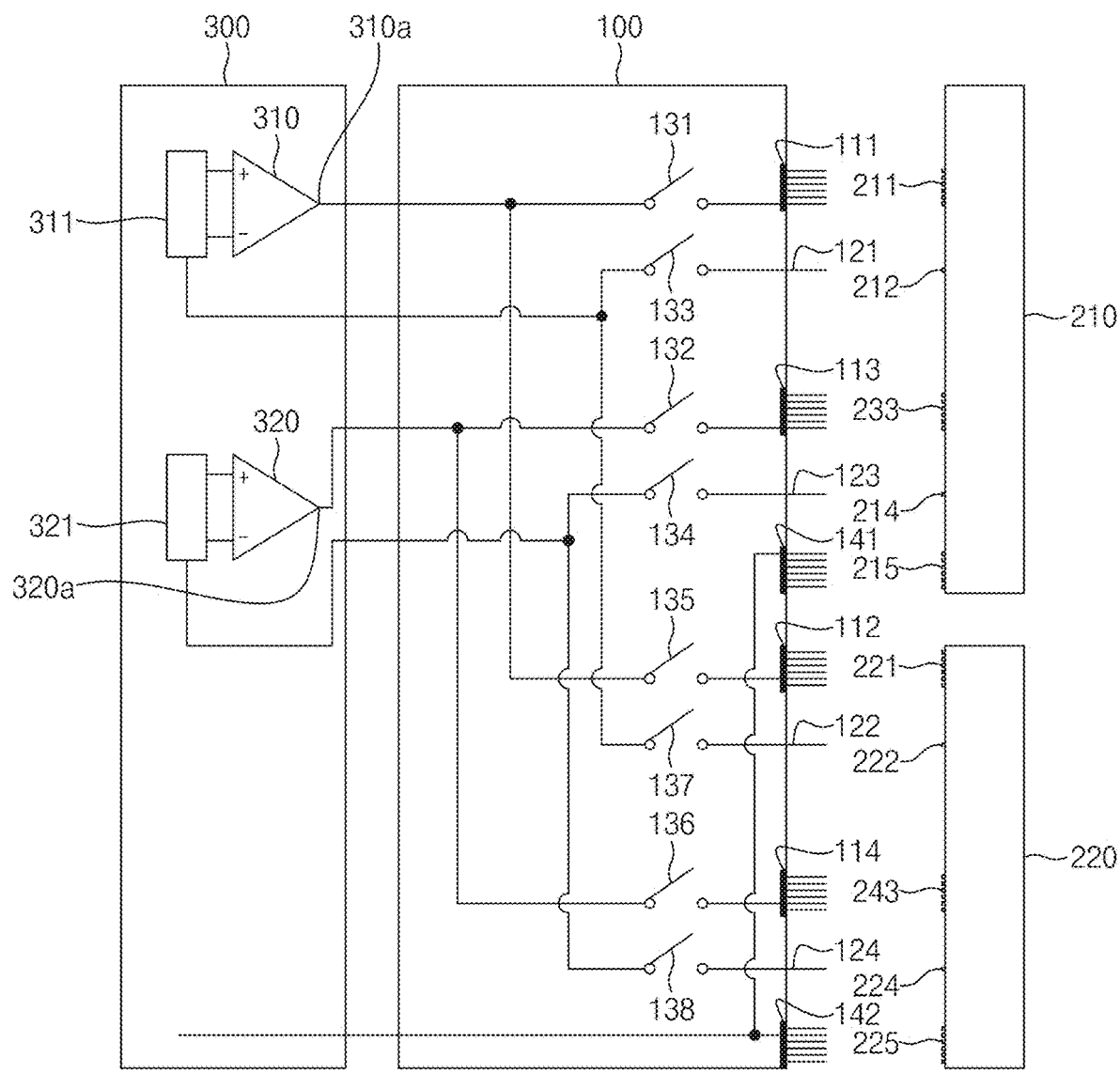
FIG. 8 is a conceptual diagram illustrating a test apparatus according to some example embodiments of the inventive concepts.

FIG. 8 is a conceptual diagram illustrating a test apparatus according to some example embodiments of the inventive concepts.

Referring to FIG. 8, a probe card 100 of the test apparatus according to some example embodiments may further include first DC probe pins 141 and second DC probe pins 142 when compared with the probe card 100 of FIG. 7.

The probe card 100 may be supplied with a DC voltage from a tester 300. The first DC probe pins 141 may provide a DC voltage to third electrode pads 215 of a first semiconductor device 210.

The second DC probe pins 142 may provide a DC voltage to third electrode pads 225 of a second semiconductor device 220.

The probe card 100 may not only provide a first voltage and a second voltage to the first semiconductor device 210 via a plurality of probe pins 111 and 113 but also provide the DC voltage to the first semiconductor device 210 via the first DC probe pins 141, thereby increasing the efficiency for testing the first semiconductor device 210.

FIG. 9 is a conceptual diagram illustrating an operation method of a test apparatus according to some example embodiments of the inventive concepts.

Referring to FIG. 9, in operation S901, the test apparatus outputs a test signal to an electrode pad of each of a plurality of semiconductor devices.

For example, the test apparatus outputs a first test signal to a first electrode pad of each of the plurality of semiconductor devices via a first probe unit of the probe card 100 using the first voltage supply 310 of the tester 300. Here, the first probe unit may include the first probe pins 111 and the second probe pins 112. The plurality of semiconductor devices may include the first semiconductor device 210 and the second semiconductor device 220. The first electrode pads may include first electrode pads 211 of the first semiconductor device 210 and first electrode pads 221 of the second semiconductor device 220. The first test signal may be a voltage signal output from the first voltage supply 310.

For example, the first test signal may be output to the first electrode pads 211 of the first semiconductor device 210 via the first probe pins 111 under control of the first repeater 131 connected to the output terminal of the first voltage supply 310 and the first probe pins 111 of the first probe unit.

The first test signal may be transmitted to the first electrode pads 221 of the second semiconductor device 220 via the second probe pins 112 through an on-off operation of the second repeater 132 connected to the output terminal of the first voltage supply 310 and the second probe pins 112 of the first probe unit.

The test apparatus may further output a second test signal to second electrode pads of each of the plurality of semiconductor devices via the second probe unit of the probe card 100 using the second voltage supply 320 of the tester 300. Here, the second probe unit may include the third probe pins 113 and the fourth probe pins 114 of the probe card 100. The second electrode pads may include the second electrode pads 233 of the first semiconductor device 210 and the second electrode pads 223 of the second semiconductor device 220. The second test signal may be a voltage signal output from the second voltage supply 320.

For example, the second test signal may be transmitted to the second electrode pads 233 of the first semiconductor device 210 via the third probe pins 113 through an on-off operation of the fifth repeater 135 connected to the output terminal of the second voltage supply 320 and the third probe pins 113 of the second probe unit.

The second test signal may be transmitted to the second electrode pads 223 of the second semiconductor device 220 via the fourth probe pins 114 through an on-off operation of the sixth repeater 136 connected to the output terminal of the second voltage supply 320 and the fourth probe pins 114 of the second probe unit.

In operation S902, the test apparatus receives a first sensing signal for the first test signal from the first sensing pad of each of the plurality of semiconductor devices using the first sensing unit of the probe card 100.

Here, the first sensing unit may include the first sensing pin 121 and the second sensing pin 122 of the probe card 100. The first sensing pad may include the first sensing pad 212 of the first semiconductor device 210 and the first sensing pad 222 of the second semiconductor device 220. The first sensing pad may include the second sensing pad 213 of the first semiconductor device 210 and the second sensing pad 243 of the second semiconductor device 220. The first sensing signal may be a voltage of the first sensing pad 212 of the first semiconductor device 210 sensed via the first sensing pin 121. The first sensing signal may be a voltage of the first sensing pad 222 of the second semiconductor device 220 sensed via the second sensing pin 122.

For example, the first sensing signal may be received from the first sensing pad 212 of the first semiconductor device 210 through the on-off operation of the third repeater 133 connected to the first controller 311 and the first sensing pin 121 of the first sensing unit.

For example, the first sensing signal may be received from the first sensing pad 222 of the second semiconductor device 220 via the second sensing pin 122 through the on-off operation of the fourth repeater 134 connected to the first controller 311 and the second sensing pin 122 of the first sensing unit.

The first sensing signal may include a first signal, which is received from the first sensing pad 212 of the first semiconductor device 210 via the first sensing pin 121, and a second signal, which is received from the first sensing pad 222 of the second sensing pin 122 via the second sensing pin 122, through the on-off operation of the third repeater 133 connected to the first controller 311 and the first and second sensing pins 121 and 122 of the first sensing unit.

The test apparatus may further receive a second sensing signal for the second test signal from a second sensing pad of each of the plurality of semiconductor devices using the second sensing unit of the probe card 100. Here, the second sensing pad may include the second sensing pad 214 of the first semiconductor device 210 and the second sensing pad 224 of the second semiconductor device 220. The second sensing signal may be a voltage of the second sensing pad 214 of the first semiconductor device 210 sensed via the third sensing pin 123. The second sensing signal may be a voltage of the second sensing pad 224 of the second semiconductor device 220 sensed via the fourth sensing pin 124.

For example, the second sensing signal may be received from the second sensing pad 214 of the first semiconductor device 210 via the third sensing pin 123 through the on-off operation of the seventh repeater 137 connected to the second controller 321 and the third sensing pin 123 of the second sensing unit.

The second sensing signal may be received from the second sensing pad 224 of the second semiconductor device 220 via the fourth sensing pin 124 through the on-off operation of the eighth repeater 138 connected to the second controller 321 and the fourth sensing pin 124 of the second sensing unit.

In operation S903, the test apparatus corrects an output value of the test signal on the basis of the sensing signal.

For example, the test apparatus may correct an output value of the first test signal using the first controller 311 of the tester 300 based on the first sensing signal received via the first sensing unit. The test apparatus may further correct an output value of the second test signal output from the second voltage supply 320 using the second controller 321 of the tester 300 based on the second sensing signal received via the second sensing unit.

In operation S904, the test apparatus outputs the test signal having the corrected output value.

For example, the test apparatus may output the first test signal having the corrected output value using the first voltage supply 310. The test apparatus may further output the second test signal having the corrected output value using the second voltage supply 320.

According to the inventive concepts, a test apparatus for testing a semiconductor device is capable of compensating for a change of a voltage by checking an increase or a decrease in the voltage due to power noise occurring in a probe card and a semiconductor device by measuring an electric potential of power supplied to the semiconductor device to operate the semiconductor device for a test, via a separate sensing pin. Thus, the test apparatus is capable of increasing the accuracy of testing the semiconductor device.

As will be appreciated by those of ordinary skill in the art, the inventive concepts described herein may be modified and changed over a wide range of applications. Accordingly, the scope of the claimed subject matter herein should not be limited to any of the example embodiments discussed above but is defined in the following claims.

What is claimed is:

1. A test apparatus, comprising:
   a tester, the tester including a voltage supply and a controller; and
   a probe card, the probe card including a first probe and a first sensing pin,
   wherein the first probe is configured to be electrically connected to both an output port of the voltage supply and an electrode pad of a first semiconductor device,
   wherein the first sensing pin is configured to be electrically connected to both the controller and a sensing pad of the first semiconductor device and is configured to sense a voltage of the first semiconductor device through the sensing pad and transmit the sensed voltage to the controller,
   wherein the controller is electrically connected to both the voltage supply and the first sensing pin and is configured to
      cause the voltage supply to provide an initial voltage to the electrode pad of the first semiconductor device via the first probe,
      receive the sensed voltage from the first sensing pin,
      determine a difference between the initial voltage and the sensed voltage,
      determine an adjustment of the initial voltage based on the determined difference to determine a corrected voltage, and
      cause the voltage supply to provide the corrected voltage to the sensing pad of the first semiconductor device via the first sensing pin.

2. The test apparatus of claim 1, wherein
   the probe card further includes a first switch connected between the output port of the voltage supply and the first probe, and
   the first switch is configured to control an electrical connection between the output port of the voltage supply and the first probe.

3. The test apparatus of claim 2, wherein:
   the probe card further includes a second switch connected between the controller and the first sensing pin, and
   the second switch is configured to control an electrical connection between the controller and the first sensing pin.

4. The test apparatus of claim 1, wherein a positive input port of the voltage supply and a negative input port of the voltage supply are each electrically connected to the controller.

5. The test apparatus of claim 1, wherein the electrode pad of the first semiconductor device and the sensing pad of the first semiconductor device are directly connected to each other.

6. The test apparatus of claim 1, wherein the first sensing pin has a thickness greater than a thickness of each pin of a plurality of pins of the first probe.

7. The test apparatus of claim 1, wherein
   the probe card further includes a second probe and a second sensing pin,
   the second probe is configured to be electrically connected to both the output port of the voltage supply and an electrode pad of a second semiconductor device, and
   the second sensing pin is configured to be electrically connected to both the controller and a sensing pad of the second semiconductor device.

8. The test apparatus of claim 7, wherein
   the probe card further includes a switch connected between the controller and the first and second sensing pins,
   one end of the switch is connected to the controller and another end of the switch is connected to both the first sensing pin and the second sensing pin, and
   the switch is configured to control an electrical connection between the controller and the first and second sensing pins.

9. A test apparatus, comprising:
   a tester, the tester including a first voltage supply, a second voltage supply, and a controller; and
   a probe card, the probe card including a first probe, a second probe, a first sensing pin, and a second sensing pin,
   wherein the first probe is configured to be electrically connected to both an output port of the first voltage supply and a first electrode pad of a first semiconductor device,
   wherein the first sensing pin is configured to be electrically connected to both the controller and a first sensing pad of the first semiconductor device and is configured to sense a voltage of the first semiconductor device through the first sensing pad and transmit the sensed voltage to the controller, wherein the controller is electrically connected to both the first voltage supply said the first sensing pin and is eon figured to
cause the first voltage supply to provide an initial voltage to the first electrode pad of the first semiconductor device via the first probe,
receive the sensed voltage from the first sensing pin,
determine a difference between the initial voltage and the sensed voltage,
determine an adjustment of the initial voltage based on the determined difference to determine a corrected voltage, and
cause the first voltage supply to provide the corrected voltage to the first sensing pad of the first semiconductor device via the first sensing pin,
wherein the second probe is configured to be electrically connected to both an output port of the second voltage supply and a second electrode pad of the first semiconductor device,
wherein the second sensing pin is configured to be electrically connected to both the controller and a second sensing pad of the first semiconductor device.

10. The test apparatus of claim 9, wherein the controller includes a first controller and a second controller, and
the first sensing pin is configured to electrically connected to the first controller, and the second sensing pin is configured to electrically connected to the second controller.

11. The test apparatus of claim 10, wherein
the probe card further includes a third probe, a fourth probe, a third sensing pin, and a fourth sensing pin,
the third probe is configured to be electrically connected to both the output port of the first voltage supply and a third electrode pad of a second semiconductor device,
the third sensing pin is configured to be electrically connected to both the first controller and a third sensing pad of the second semiconductor device,
the fourth probe is configured to be electrically connected to both the output port of the second voltage supply and a fourth electrode pad of the second semiconductor device, and
the fourth sensing pin is configured to be electrically connected to both the second controller and a fourth sensing pad of the second semiconductor device.

12. The test apparatus of claim 11, wherein the probe card further includes a first switch and a second switch, and
wherein the first switch is connected between the output port of the first voltage supply and one end of the first probe, and
wherein the second switch is connected between the output port of the first voltage supply and one end of the third probe.

13. A probe card, comprising:
a first probe;
a first sensing pin;
a second sensing pin;
a first repeater connected between an output port of a first voltage supply of a tester and the first probe; and
a second repeater connected between a first controller and the first sensing pin,
wherein the first probe is configured to be electrically connected to the output port of the first voltage supply of the tester, and a first electrode pad of a first semiconductor device,
wherein the first sensing pin is configured to be electrically connected to both the first, controller of the tester and a first sensing pad of the first semiconductor device,
wherein the second sensing pin is configured to be electrically connected to a second sensing pad of the first semiconductor device.

14. The probe card of claim 13, further including a third repeater connected between the first controller and the second sensing pin.

15. The probe card of claim 13, further including:
a second probe;
a third sensing pin; and
a fourth sensing pin,
wherein:
the second sensing pin is configured to be electrically connected to both a second controller and the second sensing pad of the first semiconductor device,
the second probe is configured to be electrically connected to both an output port of a second voltage supply of the tester and a second electrode pad of a second semiconductor device,
the third sensing pin is configured to be electrically connected to both the first controller and a third sensing pad of the second semiconductor device, and
the fourth sensing pin is configured to be electrically connected to both the second controller and a fourth sensing pad of the second semiconductor device.

16. The probe card of claim 15, further including a third repeater connected between the output port of the second voltage supply and the second probe.

17. The probe card of claim 15, further including a third repeater connected between the first controller and the third sensing pad of the second semiconductor device.

18. The probe card of claim 15, further including a third repeater connected between the second controller and the fourth sensing pad of the second semiconductor device.

* * * * *